US012771304B2

(12) United States Patent
Mroszczyk et al.

(10) Patent No.: US 12,771,304 B2
(45) Date of Patent: Oct. 20, 2026

(54) DUAL OUTPUT AMPLIFIER FOR PRECISION RESISTOR CALIBRATION SYSTEM

(71) Applicant: QUALCOMM Incorporated, San Diego, CA (US)

(72) Inventors: Przemyslaw Jan Mroszczyk, Cork (IE); Stephen Anthony Barry, Cork (IE)

(73) Assignee: QUALCOMM Incorproated, San Diego, CA (US)

( * ) Notice: Subject to any disclaimer, the term of this patent is extended or adjusted under 35 U.S.C. 154(b) by 634 days.

(21) Appl. No.: 18/361,654

(22) Filed: Jul. 28, 2023

(65) Prior Publication Data

US 2025/0038721 A1 Jan. 30, 2025

(51) Int. Cl.
*H03F 3/68* (2006.01)
*H03F 3/45* (2006.01)

(52) U.S. Cl.
CPC ........... *H03F 3/68* (2013.01); *H03F 3/45269* (2013.01); *H03F 2200/267* (2013.01);
(Continued)

(58) Field of Classification Search
CPC .. H03F 3/68; H03F 3/45269; H03F 2200/267; H03F 2200/381; H03F 2200/69; H03F 2203/45024; H03F 2203/45288; H03F 3/45192; H03F 2200/151; H03F 2200/156; H03F 2200/159;
(Continued)

(56) References Cited

U.S. PATENT DOCUMENTS 6,396,430 B1 5/2002 Li
7,538,605 B2 * 5/2009 Yen .................... H03F 3/45968
330/9

(Continued)

FOREIGN PATENT DOCUMENTS

CN 206835055 U 1/2018
EP 0150606 A1 8/1985

OTHER PUBLICATIONS

Enz C.C., et al., "Circuit Techniques for Reducing the Effects of Op-Amp Imperfections: Autozeroing, Correlated Double Sampling, and Chopper Stabilization", Proceedings of the IEEE, IEEE. New York, US, vol. 84, No. 11, Nov. 1, 1996, pp. 1584-1614, XP000642431, Section IV Entitled "Practical Impintation Issues", Subsection C Entitled "The Closed-Loop Offset Cancellation Principle", p. 1596-p. 1597, Figure 21.

(Continued)

*Primary Examiner* — Jessica Han
*Assistant Examiner* — Natasha Y Marano
(74) *Attorney, Agent, or Firm* — Loza & Loza, LLP

(57) ABSTRACT

An apparatus includes a multi-stage amplifier and a feedback switch. The multi-stage amplifier includes a first amplifier having a first input, a second input, and an output, a second amplifier having an input and an output, wherein the input of the second amplifier is coupled to the output of the first amplifier, and a third amplifier having an input and an output, wherein the input of the third amplifier is coupled to the output of the first amplifier. The feedback switch is coupled between the output of the third amplifier and the second input of the first amplifier.

18 Claims, 10 Drawing Sheets

(52) U.S. Cl.
CPC .... *H03F 2200/381* (2013.01); *H03F 2200/69* (2013.01); *H03F 2203/45024* (2013.01); *H03F 2203/45288* (2013.01)

(58) Field of Classification Search
CPC ......... H03F 2200/375; H03F 2200/471; H03F 2203/45168; H03F 2203/45281; H03F 2203/45511; H03F 2203/45536; H03F 2203/45551; H03F 2203/45588; H03F 2203/45616; H03F 2203/45664; H03F 2203/45708; H03F 3/005; H03F 3/45475; G01R 27/02; G01R 35/005
USPC ........... 330/9, 3; 375/219; 341/155; 327/541
See application file for complete search history.

(56) References Cited

U.S. PATENT DOCUMENTS

| | | | |
|---|---|---|---|
| 10,419,067 | B1 | 9/2019 | Koay et al. |
| 2003/0128072 | A1 | 7/2003 | Tran et al. |
| 2003/0184459 | A1 | 10/2003 | Engl |
| 2008/0258809 | A1 | 10/2008 | Yen |
| 2014/0266445 | A1 | 9/2014 | Albinet |
| 2014/0292410 | A1 | 10/2014 | Danjo |
| 2018/0234056 | A1 | 8/2018 | Sun et al. |
| 2022/0404847 | A1 | 12/2022 | Tian |

OTHER PUBLICATIONS

Gu Y., et al., “A 32Gb/s NRZ Wireline Transmitter with CMFB-Based CML Driver in 28nm CMOS Technology”, 2021 IEEE International Midwest Symposium on Circuits and Systems (MWSCAS), IEEE, Aug. 9, 2021, pp. 14-17, XP033972630, Section IV Entitled “Transmitter Impintation”, Subsection C Entitled “Resistor Calibration”, p. 15, Figure 3.
International Search Report and Written Opinion—PCT/US2024/031649—ISA/EPO—Sep. 26, 2024.

* cited by examiner

DUAL OUTPUT AMPLIFIER FOR PRECISION RESISTOR CALIBRATION SYSTEM

FIELD

Aspects of the present disclosure relate generally to amplifiers, and, more particularly, to amplifiers for resistor calibration.

BACKGROUND

A chip may include one or more programmable on-chip resistors. For example, the one or more programmable on-chip resistors may be used in a voltage reference circuit for generating a reference voltage on the chip, a current reference circuit for generating a reference current on the chip, and/or another type of circuit. The one or more programmable on-chip resistors may also be used as termination resistors (e.g., to provide impedance matching in a front-end transceiver). The chip may also include a resistor calibration system configured to set the resistance of a programmable on-chip resistor to a desired resistance (e.g., based on the resistance of an external resistor).

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to an apparatus. The apparatus includes a multi-stage amplifier and a feedback switch. The multi-stage amplifier includes a first amplifier having a first input, a second input, and an output, a second amplifier having an input and an output, wherein the input of the second amplifier is coupled to the output of the first amplifier, and a third amplifier having an input and an output, wherein the input of the third amplifier is coupled to the output of the first amplifier. The feedback switch is coupled between the output of the third amplifier and the second input of the first amplifier.

A second aspect relates to a method of operating a multi-stage amplifier, the multi-stage amplifier including a first amplifier having a first input and a second input, a second amplifier, and a third amplifier. The method includes, during a first phase, coupling an output of the third amplifier to the second input of the first amplifier, and driving an input of the third amplifier using an output of the first amplifier. The method also includes, during a second phase, driving an input of the second amplifier using the output of the first amplifier.

BRIEF DESCRIPTION OF THE DRA WINGS

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
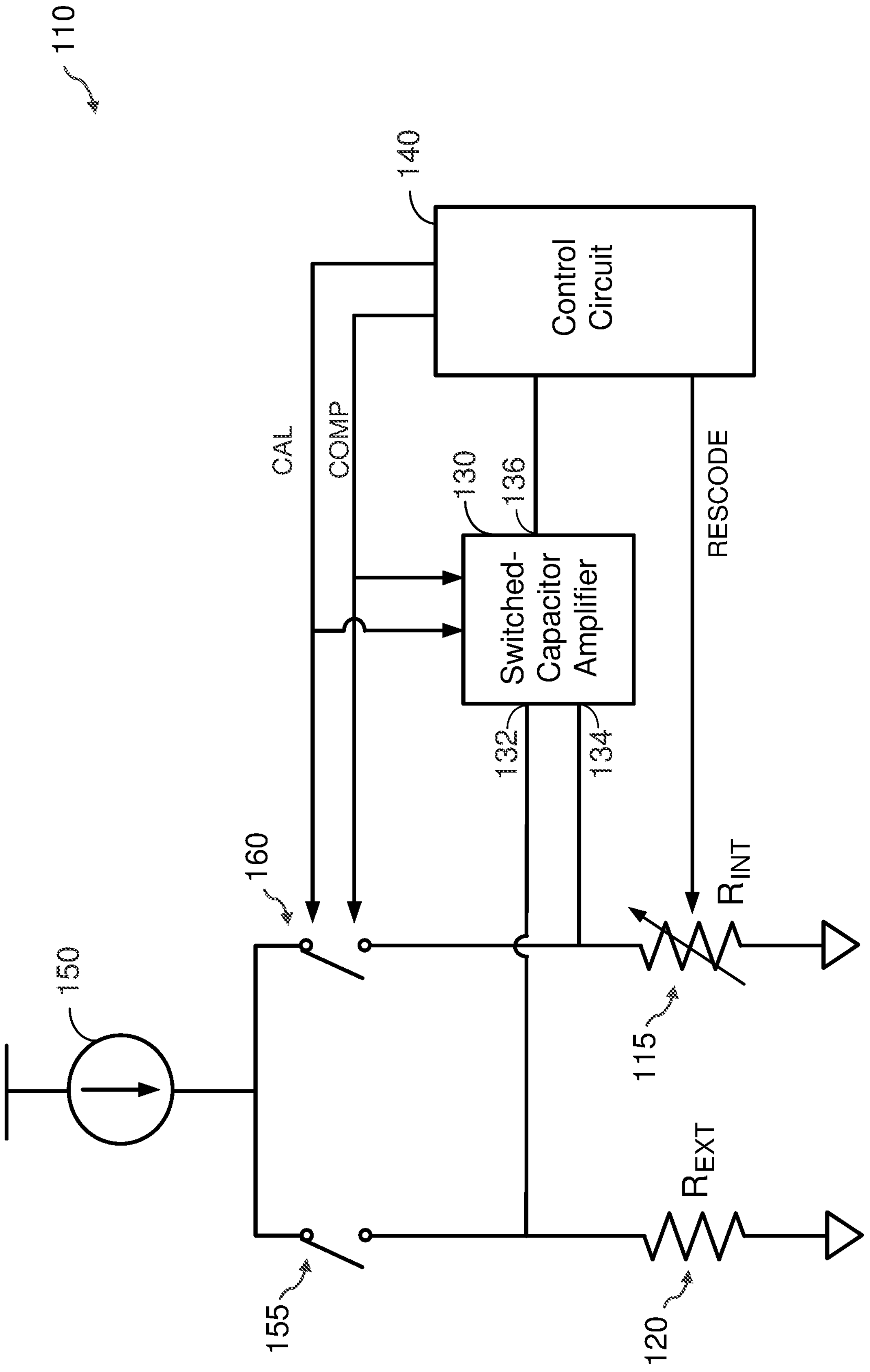
FIG. 1 shows an example of a resistor calibration system according to certain aspects of the present disclosure.

FIG. 1 shows an example of an on-chip resistor 115 integrated on a chip, in which the on-chip resistor 115 has a programmable resistance. FIG. 1 also shows an example of a resistor calibration system 110 configured to set the resistance of the on-chip resistor 115 based on the resistance of an external resistor 120. For example, the resistor calibration system 110 may set the resistance of the on-chip resistor 115 to a resistance approximately equal to the resistance of the external resistor 120. The external resistor 120 (i.e., off-chip resistor) may be coupled to the chip via a pad (not shown) on the chip.

The on-chip resistor 115 may be implemented with a network of resistors and switches in which the resistance of the on-chip resistor 115 is adjusted (i.e., tuned) by controlling the on/off states of the switches in the network. In other implementations, the on-chip may be implemented with a network of resistors and fuses in which the resistance of the on-chip resistor 115 is adjusted by controlling which fuses are blown in the network. It is to be appreciated that the on-chip resistor 115 is not limited to the above examples, and that the on-chip resistor 115 may be implemented with another type of programmable resistor.

The calibration system 110 includes a current source 150, a first switch 155, a second switch 160, a switched-capacitor amplifier 130, and a control circuit 140 (e.g., finite state machine (FSM)). The first switch 155 is coupled between the current source 150 and the external resistor 120, and the second switch 160 is coupled between the current source 150 and the on-chip resistor 115. The switched-capacitor amplifier 130 has a first input 132 coupled between the first switch 155 and the external resistor 120, a second input 134 coupled between the second switch 160 and the on-chip resistor 115, and an output 136.

The control circuit 140 is coupled to the output 136 of the switched-capacitor amplifier 130. The control circuit 140 is configured to control the on/off states of the first switch 155 and the second switch 160, and adjust the resistance of the on-chip resistor 115 (e.g., using a digital code labeled "RESCODE") based on the output 136 of the switched-capacitor amplifier 130, as discussed further below. Each of the first switch 155 and the second switch 160 may be implemented with a transistor or another type of switch.

In certain aspects, the calibration system 110 calibrates the resistance of the on-chip resistor 115 as follows. During a first phase (also referred to as a calibration phase), the control circuit 140 closes (i.e., turns on) the first switch 155 and opens (i.e., turns off) the second switch 160. This causes the current of the current source 150 to flow through the external resistor 120, which generates a voltage drop across the external resistor 120 that is proportional to the resistance of the external resistor 120. The switched-capacitor amplifier 130 samples the voltage drop across the external resistor 120.

During a second phase (also referred to as a compare phase), the control circuit 140 opens the first switch 155 and closes the second switch 160. This causes the current of the current source 150 to flow through the on-chip resistor 115, which generates a voltage drop across the on-chip resistor 115 that is proportional to the resistance of the on-chip resistor 115. The switched-capacitor amplifier 130 samples the voltage drop across the on-chip resistor 115, and outputs a compare signal at the output 136 indicating whether the sampled voltage drop across the on-chip resistor 115 is greater than or less than the sampled voltage across the external resistor 120. Since the voltage drop across the on-chip resistor 115 is proportional to the resistance of the on-chip resistor 115 and the voltage drop across the external resistor 120 is proportional to the resistance of the external resistor 120, the compare signal indicates whether the resistance of the on-chip resistor 115 is greater than or less than the resistance of the external resistor 120.

The control circuit 140 receives the compare signal from the switched-capacitor amplifier 130, and adjusts (i.e., tunes) the resistance of the on-chip resistor 115 based on the compare signal. For example, if the compare signal indicates the resistance of the on-chip resistor 115 is less than the resistance of the external resistor 120, then the control circuit 140 may increase the resistance of the on-chip resistor 115.

The control circuit 140 may repeat the above process until the resistance of the on-chip resistor 115 is approximately equal to the resistance of the external resistor 120. For example, in some implementations, the compare signal may have a first logic value (e.g., one) when the resistance of the external resistor 120 is greater than the resistance of the on-chip resistor 115, and a second logic value (e.g., zero) when the resistance of the external resistor 120 is less than the resistance of the on-chip resistor 115. In this example, the control circuit 140 may repeat the above process until the compare signal flips logic values.

Figure 2:
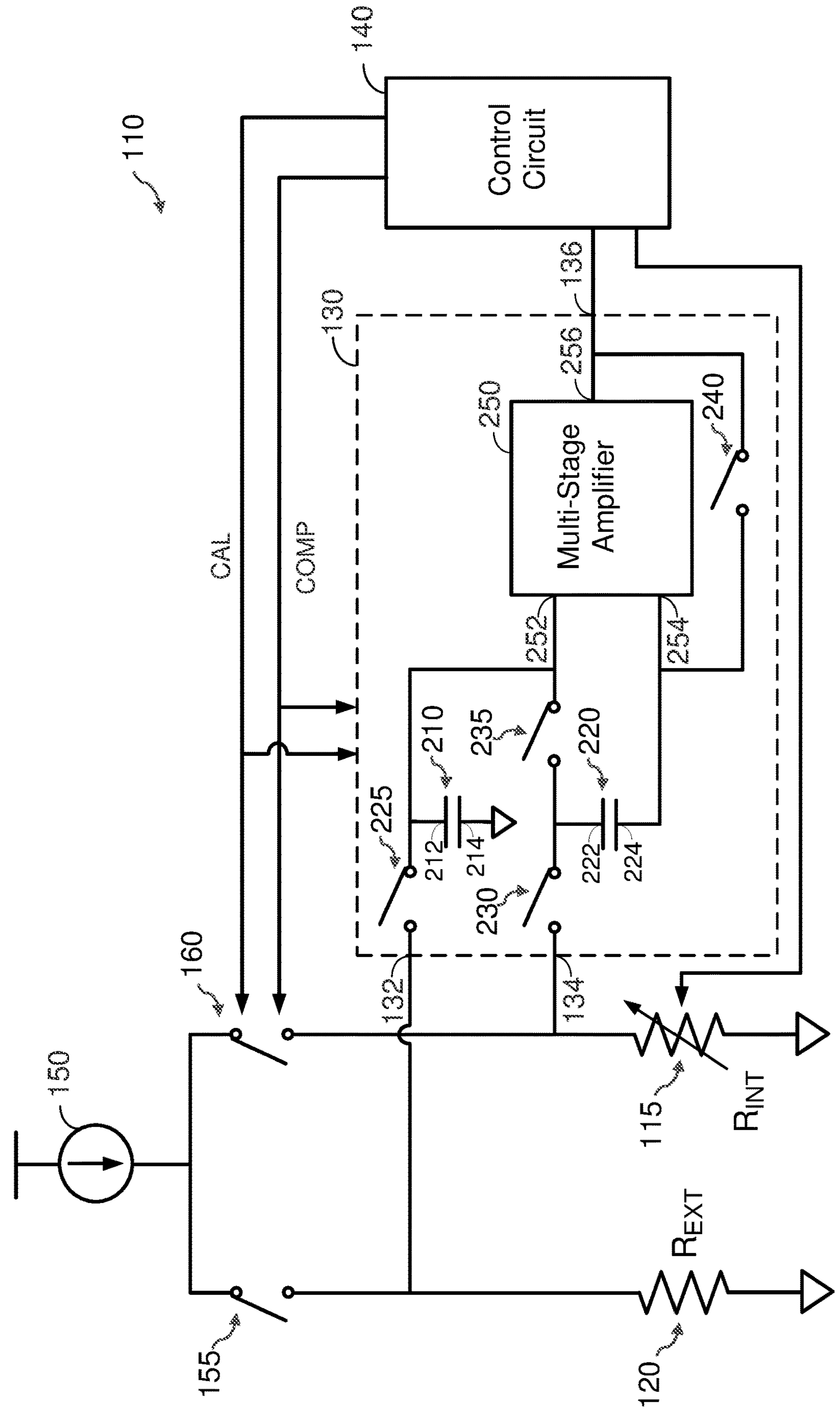
FIG. 2 shows an exemplary implementation of a switched-capacitor amplifier according to certain aspects of the present disclosure.

FIG. 2 shows an exemplary implementation of the switched-capacitor amplifier 130. In this example, the switched-capacitor amplifier 130 includes a third switch 225, a fourth switch 230, a fifth switch 235, a sixth switch 240, a first capacitor 210, and a second capacitor 220. The switched-capacitor amplifier 130 also includes a multi-stage amplifier 250 having a first input 252, a second input 254, and an output 256. An exemplary implementation of the multi-stage amplifier 250 is discussed further below with reference to FIG. 4.

In the example shown in FIG. 2, the third switch 225 is coupled between the first input 132 of the switched-capacitor amplifier 130 and the first input 252 of the multi-stage amplifier 250. A first terminal 212 of the first capacitor 210 is coupled to the first input 252 of the multi-stage amplifier 250 and a second terminal 214 of the first capacitor 210 is coupled to a ground.

The fourth switch 230 is coupled between the second input 134 of the switched-capacitor amplifier 130 and a first terminal 222 of the second capacitor 220. The fifth switch 235 is coupled between the first input 252 of the multi-stage amplifier 250 and the first terminal 222 of the second capacitor 220. A second terminal 224 of the second capacitor 220 is coupled to the second input 254 of the multi-stage amplifier 250. The sixth switch 240 is coupled between the output 256 of the multi-stage amplifier 250 and the second input 254 of the multi-stage amplifier 250.

Exemplary operations of the switched-capacitor amplifier 130 will now be discussed according to certain aspects.

Figure 3A:
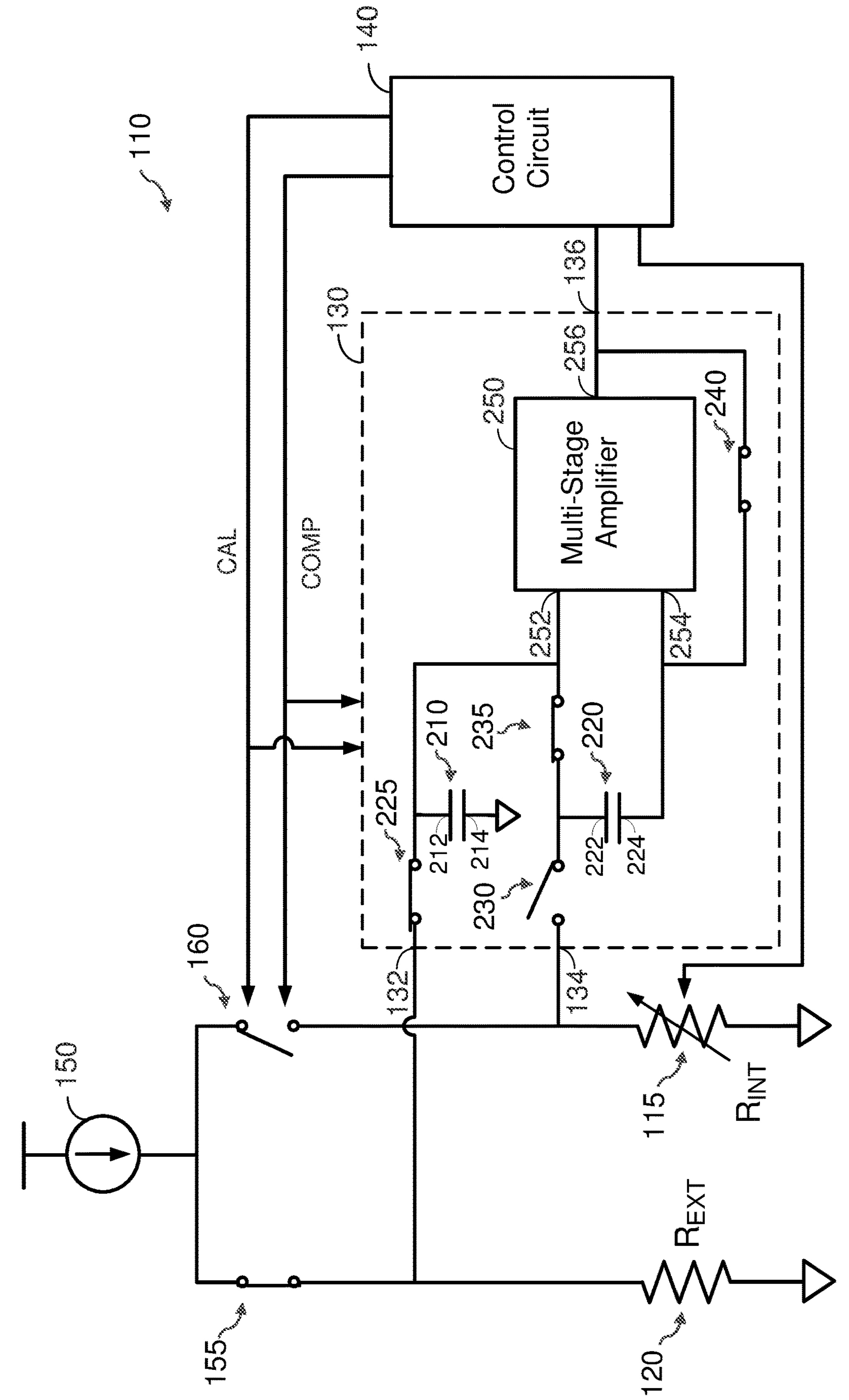
FIG. 3A shows configurations of switches in the switched-capacitor amplifier during a first phase according to certain aspects of the present disclosure.

During the first phase, the control circuit 140 closes the first switch 155, the third switch 225, the fifth switch 235, and the sixth switch 240, and opens the second switch 160 and the fourth switch 230. The configurations of the switches 155, 160, 225, 230, 235, and 240 during the first phase are shown in FIG. 3A. As shown in FIG. 3A, the first capacitor 210 is coupled to the external resistor 120 through the third switch 225. This causes the first capacitor 210 to sample the voltage across the external resistor 120 during the first phase. In addition, the second capacitor 220 is coupled between the first input 252 and the second input 254 of the multi-stage amplifier 250 through the fifth switch 235, and the output 256 of the multi-stage amplifier 250 is coupled to the second input 254 of the multi-stage amplifier 250 through the sixth switch 240 (i.e., the sixth switch 240 closes a feedback loop between the output 256 and the second input 254). This causes the second capacitor 220 to sample an input offset voltage of the multi-stage amplifier 250.

Figure 3B:
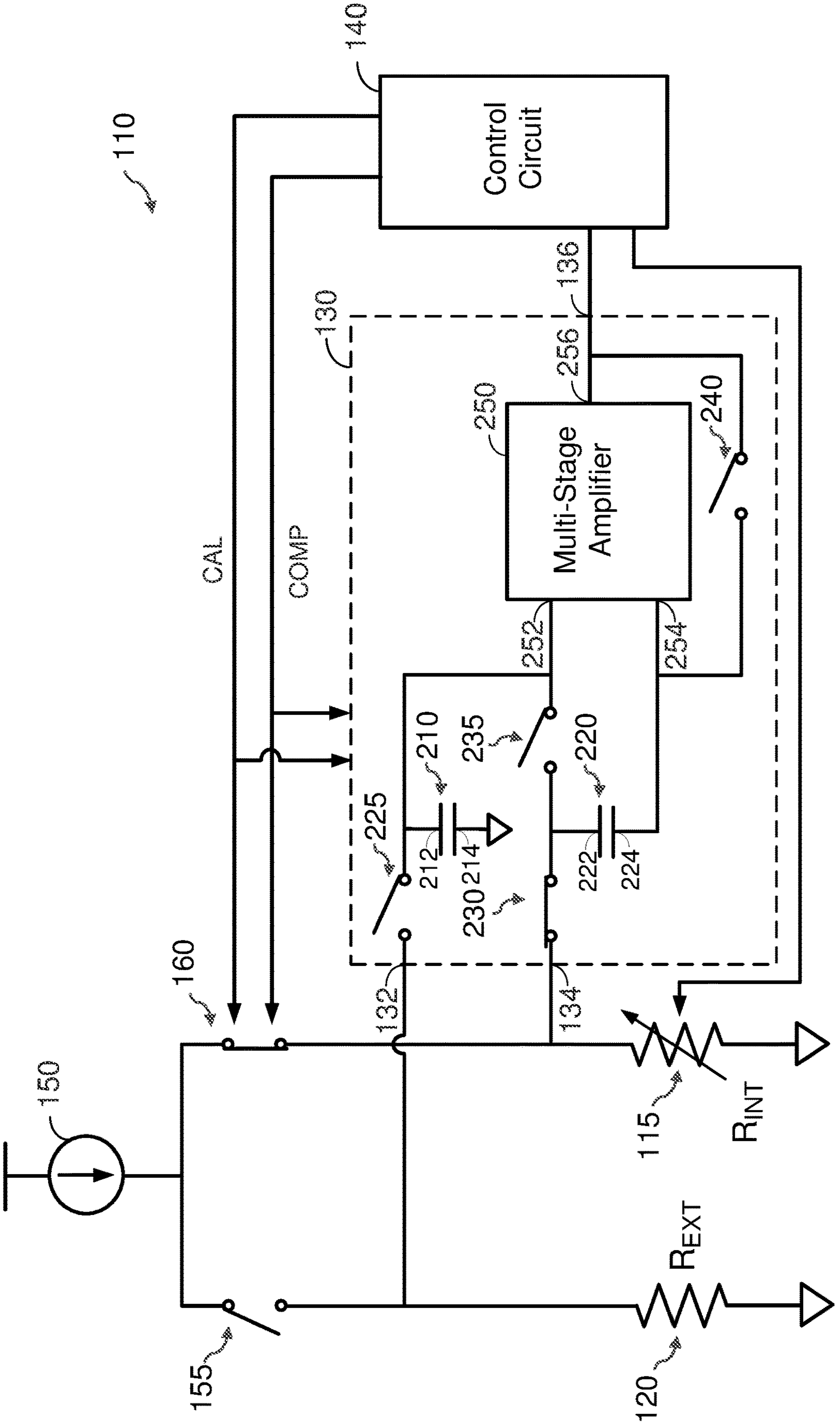
FIG. 3B shows configurations of the switches in the switched-capacitor amplifier during a second phase according to certain aspects of the present disclosure.

During the second phase, the control circuit 140 opens the first switch 155, the third switch 225, the fifth switch 235, and the sixth switch 240, and closes the second switch 160 and the fourth switch 230. The configurations of the switches 155, 160, 225, 230, 235, and 240 during the second phase are shown in FIG. 3B. As shown in FIG. 3B, the second capacitor 220 is coupled to the on-chip resistor 115 through the fourth switch 230. This causes the second capacitor 220 to sample the voltage across the on-chip resistor 115 during the second phase. During the second phase, the multi-stage amplifier 250 compares the voltage across the external resistor 120 sampled by the first capacitor 210 during the first phase with the voltage across the on-chip resistor 115 sampled by the second capacitor 220, generates the compare signal based on the comparison, and outputs the compare signal at the output 256. As discussed above, the compare signal indicates whether the resistance of the on-chip resistor 115 is greater than or less than the resistance of the external resistor 120. Also, during the second phase, the input offset voltage of the multi-stage amplifier 250 sampled by the second capacitor 220 during the first phase compensates for the input offset voltage of the multi-stage amplifier 250 during the second phase so that the input offset voltage has little to no effect on the compare signal.

Figure 4:
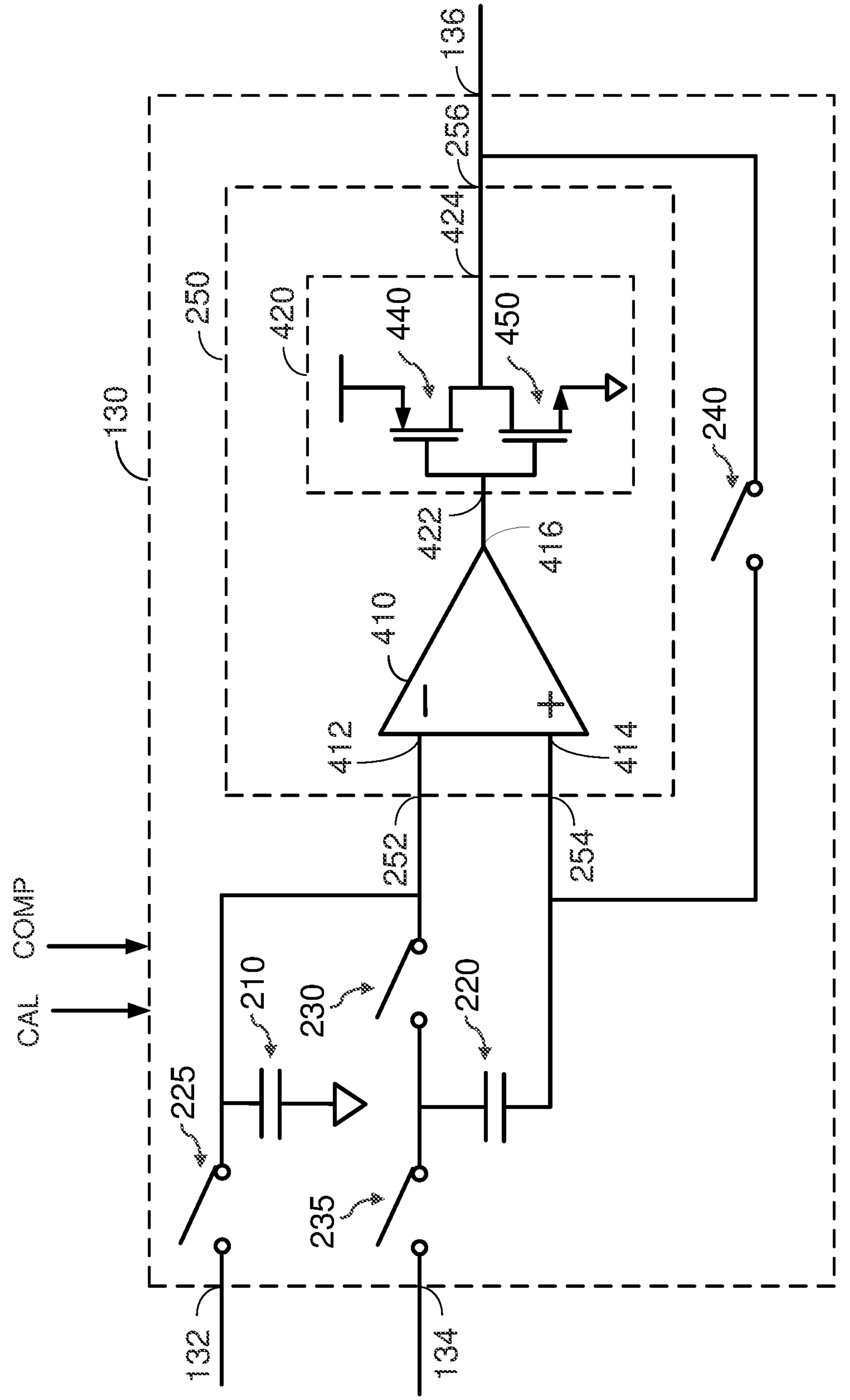
FIG. 4 shows an example of a multi-stage amplifier according to certain aspects of the present disclosure.

FIG. 4 shows an exemplary implementation of the multi-stage amplifier 250. In this example, the multi-stage amplifier 250 includes an operational transconductance amplifier (OTA) 410 in the first stage, and an inverter 420 in the second stage (also referred to as the output stage). In this example, the OTA 410 has a first input 412, a second input 414, and an output 416, in which the first input 412 is coupled to the first input 252 of the multi-stage amplifier 250 and the second input 414 is coupled to the second input 254 of the multi-stage amplifier 250.

The inverter 420 has an input 422 coupled to the output 416 of the OTA 410, and an output 424 coupled to the output 256 of the multi-stage amplifier 250. The inverter 420 is used to produce a rail-to-rail output swing at the output 256. In the example shown in FIG. 4, the inverter 420 is implemented with a complementary inverter including a p-type field effect transistor (PFET) 440 and an n-type field effect transistor (NFET) 450. As used herein, a "rail-to-rail signal" is a signal having a voltage swing that swings between a voltage approximately equal to the voltage of a first rail (e.g., supply voltage of a supply rail) and a voltage approximately equal to the voltage of a second rail (e.g., ground potential of a ground rail).

During the first phase, the multi-stage amplifier 250 operates in a closed loop. This is because the sixth switch 240 is closed during the first phase, and therefore couples the output 256 to the second input 254. Since the multi-stage amplifier 250 operates in a closed loop during the first phase, it is desirable for the multi-stage amplifier 250 to achieve a good stability margin (i.e., above 60 degrees) and a relatively high loop gain.

During the second phase, the multi-stage amplifier 250 operates as an open loop comparator since the sixth switch 240 is open during the second phase. During the second phase, it is desirable for the multi-stage amplifier 250 to provide the compare signal at the output 256 with a rail-to-rail swing to clearly indicate to the control circuit 140 (not shown in FIG. 4) whether the resistance of the external resistor 120 is greater than or less than the on-chip resistor 115.

A challenge with the multi-stage amplifier 250 is achieving both a good stability margin for the closed loop during the first phase and a rail-to-rail output swing during the second phase. For instance, the implementation in FIG. 4 has two closely spaced poles due to capacitance (not shown) at the output of the OTA 410 and capacitance (not shown) at the output of the inverter 420, which degrades the stability margin. Conventional approaches for resolving the stability issue such as pole separation and Miller compensation may not be feasible. Pole separation may not be feasible due to the negative effects of pole separation on bandwidth and charge leakage. For example, increasing the capacitance at the output of the OTA 410 or the capacitance at the output of the inverter 420 to increase the pole separation reduces the bandwidth and the slew rate of the multi-stage amplifier 250. Miller compensation may not be effective due to process sensitivity of the inverter 420 with uncontrolled bias current. Removing the inverter 420 to improve stability during the first phase may not be feasible because the inverter 420 is needed to produce a rail-to-rail output swing during the second phase.

To address the above, aspects of the present disclosure provide a multi-stage amplifier including separate output stages for the first phase and the second phase, in which the output stage for the first phase provides good loop stability and the output stage for the second phase provides a rail-to-rail output swing for the compare signal. In certain aspects, the output stage for the first phase includes a source-follower amplifier and the output stage for the second phase includes one or more inverters. The above features and other features of the present disclosure are discussed further below.

Figure 5:
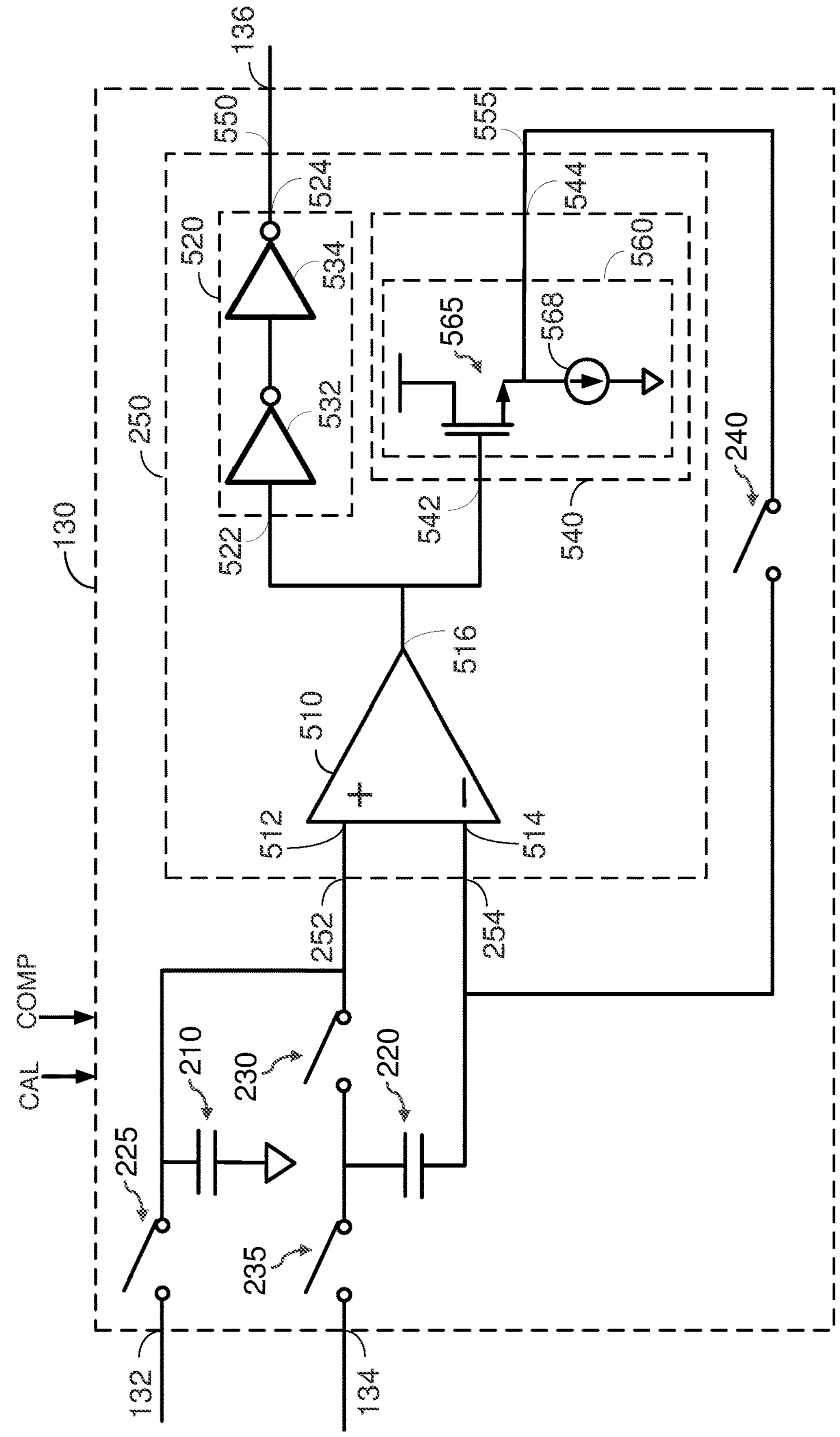
FIG. 5 shows an example of a multi-stage amplifier with multiple outputs according to certain aspects of the present disclosure.

FIG. 5 shows an example in which the multi-stage amplifier 250 has multiple outputs (e.g., dual outputs) according to aspects of the present disclosure. The multiple outputs include a first output 550 coupled to the control circuit 140 (shown in FIGS. 1 and 2). The first output 550 is configured to output the compare signal during the second phase, as discussed further below. The multiple outputs also include a second output 555 in which the sixth switch 240 is coupled between the second output 555 and the second input 254.

In this example, the multi-stage amplifier includes a first amplifier 510, a second amplifier 520, and a third amplifier 540. The first amplifier 510 provides a first-stage amplifier for the multi-stage amplifier 250 that drives both the second amplifier 520 and the third amplifier 540, as discussed further below. The first amplifier 510 may be implemented with a cascode amplifier or another type of amplifier. The first amplifier 510 has a first input 512 coupled to the first input 252 of the multi-stage amplifier 250, a second input 514 coupled to the second input 254 of the multi-stage amplifier 250, and an output 516.

The second amplifier 520 has an input 522 coupled to the output 516 of the first amplifier 510, and an output 524 coupled to the first output 550 of the multi-stage amplifier 250 (which is coupled to the control circuit 140 shown in FIG. 1). In certain aspects, the second amplifier 520 is configured to receive the output signal of the first amplifier 510 and generate a rail-to-rail signal at the first output 550 based on the output signal of the first amplifier 510, in which the rail-to-rail signal provides the compare signal to the control circuit 140 during the second phase.

For example, the rail-to-rail signal may swing between a voltage approximately equal to a supply voltage on a supply rail and a voltage approximately equal to a ground potential on a ground rail. In this example, the rail-to-rail signal provides a digital signal in which the supply voltage represents a logic one and the ground potential represents a logic zero. The logic one may indicate the resistance of the external resistor 120 (shown in FIG. 1) is greater than the resistance of the on-chip resistor 115 (shown in FIG. 1) and the logic zero may indicate the resistance of the external resistor 120 is less than the resistance of the on-chip resistor 115, or vice versa.

In the example shown in FIG. 5, the second amplifier 520 includes a first inverter 532 and a second inverter 534 coupled in series. However, it is to be appreciated that the present disclosure is not limited to this example. In general, the second amplifier 520 includes one or more inverters coupled in series. The second amplifier 520 may also be referred to as a buffer stage or another term.

The third amplifier 540 has an input 542 coupled to the output 516 of the first amplifier 510, and an output 544 coupled to the second output 555 of the multi-stage amplifier 250. In this example, the sixth switch 240 (also referred to as a feedback switch) is coupled between the output 544 of the third amplifier 540 and the second input 514 of the first amplifier 510. As a result, when the sixth switch 240 is closed during the first phase, the first amplifier 510 and the third amplifier 540 are coupled in the closed loop discussed above while the second amplifier 520 is outside of the closed loop. Because the second amplifier 520 is outside the closed loop during the first phase, the one or more inverters (e.g., inverters 532 and 534) in the second amplifier 520 have little to no effect on the stability margin of the loop. As a result, the first amplifier 510 and the third amplifier 540 are not restricted by the limitations placed on the stability margin due to the one or more inverters in the second amplifier 520. This allows the first amplifier 510 and the third amplifier 540 to achieve a good loop stability during the first phase. In contrast, in the amplifier design shown in FIG. 4, the inverter 420 is in the closed loop during the first phase, and therefore limits the ability to achieve a good stability margin during the first phase.

In the example shown in FIG. 5, the third amplifier 540 includes a source-follower amplifier 560 (also referred to as a common-drain amplifier). In this example, the source-follower amplifier 560 is able to drive the second output 555 of the multi-stage amplifier 250 with significantly better loop stability than the one or more inverters in the second amplifier 520. The source-follower amplifier 560 also shifts the voltage of the output signal of the first amplifier 510 to a lower voltage. The downward voltage level shifting may be used for low common mode operation. For example, low common mode operation may be useful for cases where the voltage across the external resistor 120 during the first phase is relatively low compared to the supply voltage (e.g., due to technology and/or product constraints that limit the use of a larger resistor or a higher current for the current source 150 (shown in FIG. 1). In this example, the first amplifier 510 provides high loop gain while the source-follower amplifier 560 provides voltage level shifting for low common mode operation.

In the example shown in FIG. 5, the source-follower amplifier 560 includes a transistor 565 (e.g., an NFET) and a current source 568. In this example, the drain of the transistor 565 is coupled to a supply rail, the gate of the transistor 565 is coupled to the output 516 of the first amplifier 510, and the source of the transistor 565 is coupled to the second output 555 of the multi-stage amplifier 250. The current source 568 is coupled between the source of the transistor 565 and a ground, and is configured to provide a bias current for the transistor 565. The current source 568 may be implemented with a transistor in which the current of the current source 568 depends on a gate bias voltage of the transistor.

Thus, in this example, the second amplifier 520 provides rail-to-rail swing for the compare signal during the second phase, and the third amplifier 540 provides good loop stability during the first phase. Since the one or more inverters (e.g., inverters 532 and 534) in the second amplifier 520 are separate from the third amplifier 540, the one or more inverters are able to provide rail-to-rail output swing during the second phase while not affecting the stability margin of the closed loop during the first phase. In this example, the second amplifier 520 is used as a first output stage for the second phase to generate the compare signal, and the third amplifier 540 is used as a second output stage for the first phase to provide good stability in the closed loop configuration.

Figure 6:
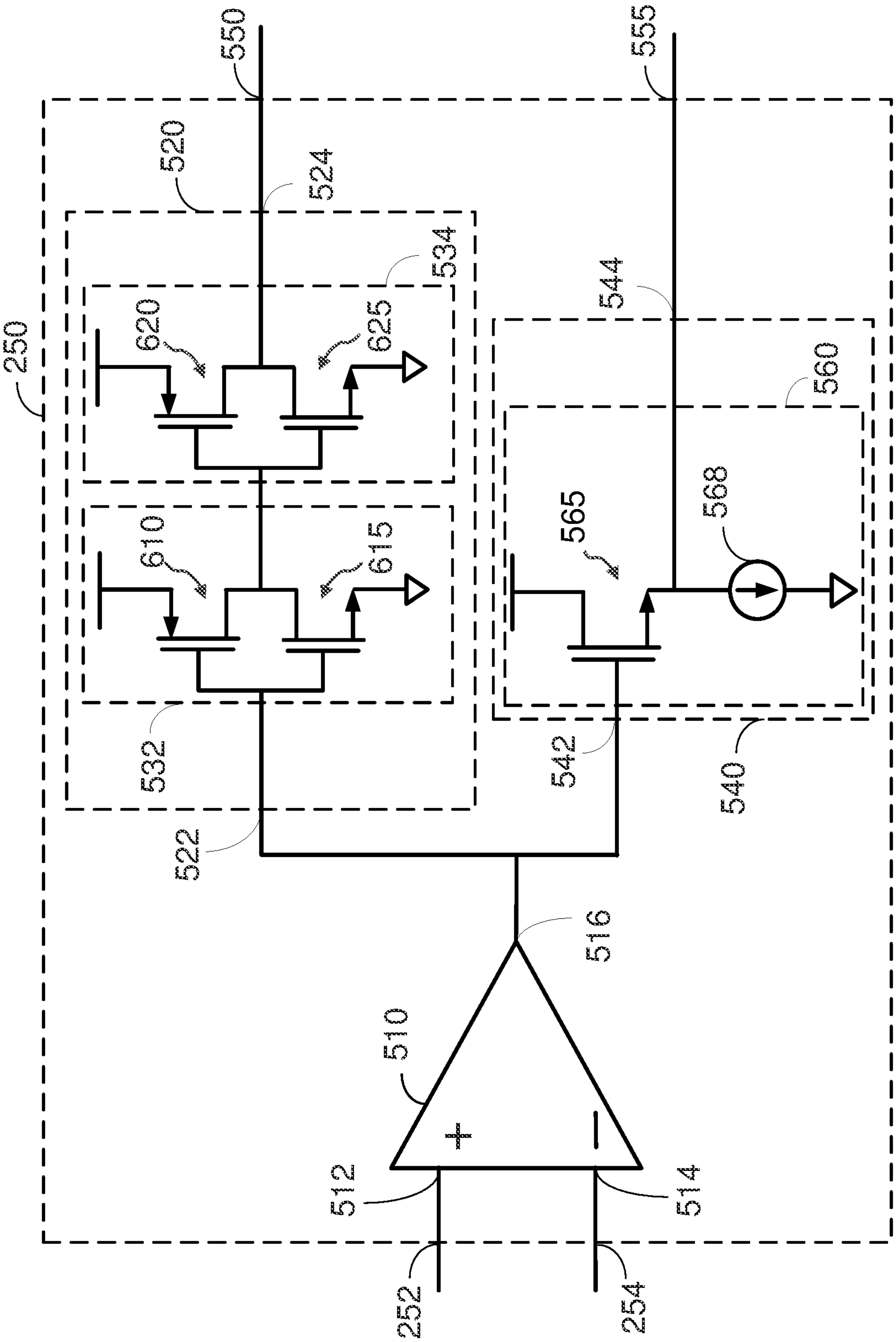
FIG. 6 shows an exemplary implementation of inverters in the multi-stage amplifier according to certain aspects of the present disclosure.

FIG. 6 shows an example where each of the inverters 532 and 534 is implemented with a respective complementary inverter. In this example, the first inverter 532 includes a PFET 610 and an NFET 615 in which the source of the PFET 610 is coupled to the supply rail, the source of the NFET 615 is coupled to the ground rail, the gates of the PFET 610 and the NFET 615 are coupled to the input of the first inverter 532, and the drains of the PFET 610 and the NFET 615 are coupled to the output of the first inverter 532. The second inverter 534 includes a PFET 620 and an NFET 625 in which the source of the PFET 620 is coupled to the supply rail, the source of the NFET 625 is coupled to a ground, the gates of the PFET 620 and the NFET 625 are coupled to the input of the second inverter 534, and the drains of the PFET 620 and the NFET 625 are coupled to the output of the second inverter 534. It is to be appreciated that the inverters 532 and 534 are not limited to the exemplary implementation shown in FIG. 6.

Figure 7:
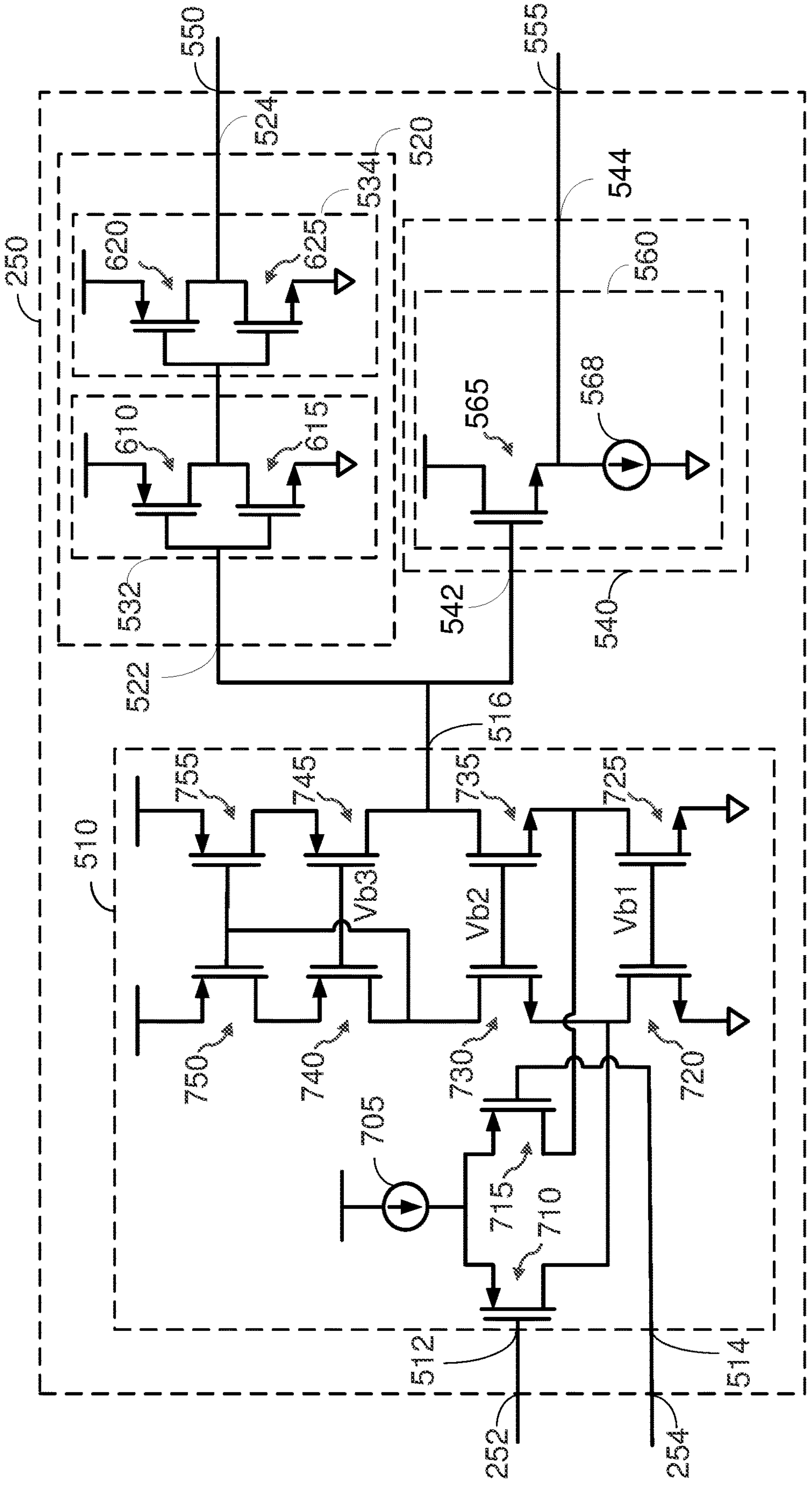
FIG. 7 shows an exemplary implementation of a first-stage amplifier in the multi-stage amplifier according to certain aspects of the present disclosure.

FIG. 7 shows an example in which the first amplifier 510 is implemented with a cascode amplifier (e.g., a folded-cascode amplifier). As used herein, a "cascode amplifier" is an amplifier with one or more transistors in a common-source configuration coupled to one or more transistors in a common-gate configuration.

In the example in FIG. 7, the first amplifier 510 includes a first transistor 710, a second transistor 715, and a current source 705. The gate of the first transistor 710 is coupled to the first input 512, and the gate of the second transistor 715 is coupled to the second input 514. The current source 705 is coupled to the sources of the first transistor 710 and the second transistor 715 to provide the transistors 710 and 715 with a bias current. In this example, each of the transistors 710 and 715 is implemented with a respective PFET.

The first amplifier 510 also includes a third transistor 720, a fourth transistor 725, a fifth transistor 730, a sixth transistor 735, a seventh transistor 740, an eighth transistor 745, a ninth transistor 750, and a tenth transistor 755. In this example, each of the transistors 720, 725, 730, and 735 is implemented with a respective NFET, and each of the transistors 740, 745, 750, and 755 is implemented with a respective PFET.

The sources of the third transistor 720 and the fourth transistor 725 are coupled to a ground. The drain of the third transistor 720 is coupled to the source of the fifth transistor 730, and the drain of the fourth transistor 725 is coupled to the source of the sixth transistor 735. The gates of the third transistor 720 and the fourth transistor 725 are biased by a first bias voltage (labeled "Vb1"). The gates of the fifth transistor 730 and the sixth transistor 735 are biased by a second bias voltage (labeled "Vb2"). The drain of the first transistor 710 is coupled between the drain of the third transistor 720 and the source of the fifth transistor 730, and the drain of the second transistor 715 is coupled between the drain of the fourth transistor 725 and the source of the sixth transistor 735.

The sources of the ninth transistor 750 and the tenth transistor 755 are coupled to a supply rail, the drain of the ninth transistor 750 is coupled to the source of the seventh transistor 740, the drain of the tenth transistor 755 is coupled to the source of the eighth transistor 745, and the gates of the ninth transistor 750 and the tenth transistor 755 are coupled to the drain of the seventh transistor 740. The drain of the seventh transistor 740 is coupled to the drain of the fifth transistor 730, the drain of the eighth transistor 745 is coupled to the drain of the sixth transistor 735, and the gates of the seventh transistor 740 and the eighth transistor 745 are biased by a third bias voltage (labeled "Vb3"). The output 516 of the first amplifier 510 is coupled between the drain of the sixth transistor 735 and the drain of the eighth transistor 745.

In this example, the folded cascode configuration provides the first amplifier 510 with a high output impedance, which translates into a high gain (e.g., for a high loop gain in the first phase). However, it is to be appreciated that the first amplifier 510 is not limited to a folded-cascode amplifier, and that the first amplifier 510 may be implemented with other amplifier configurations.

In some implementations, the multi-stage amplifier 250 may include switches to selectively enable/disable the amplifiers 510, 520, and 540. For example, the switches may be used to disable the amplifiers 510, 520, and 540 to prevent leakage current after resistor calibration is done and the calibration system 110 is placed into a low power mode.

Figure 8:
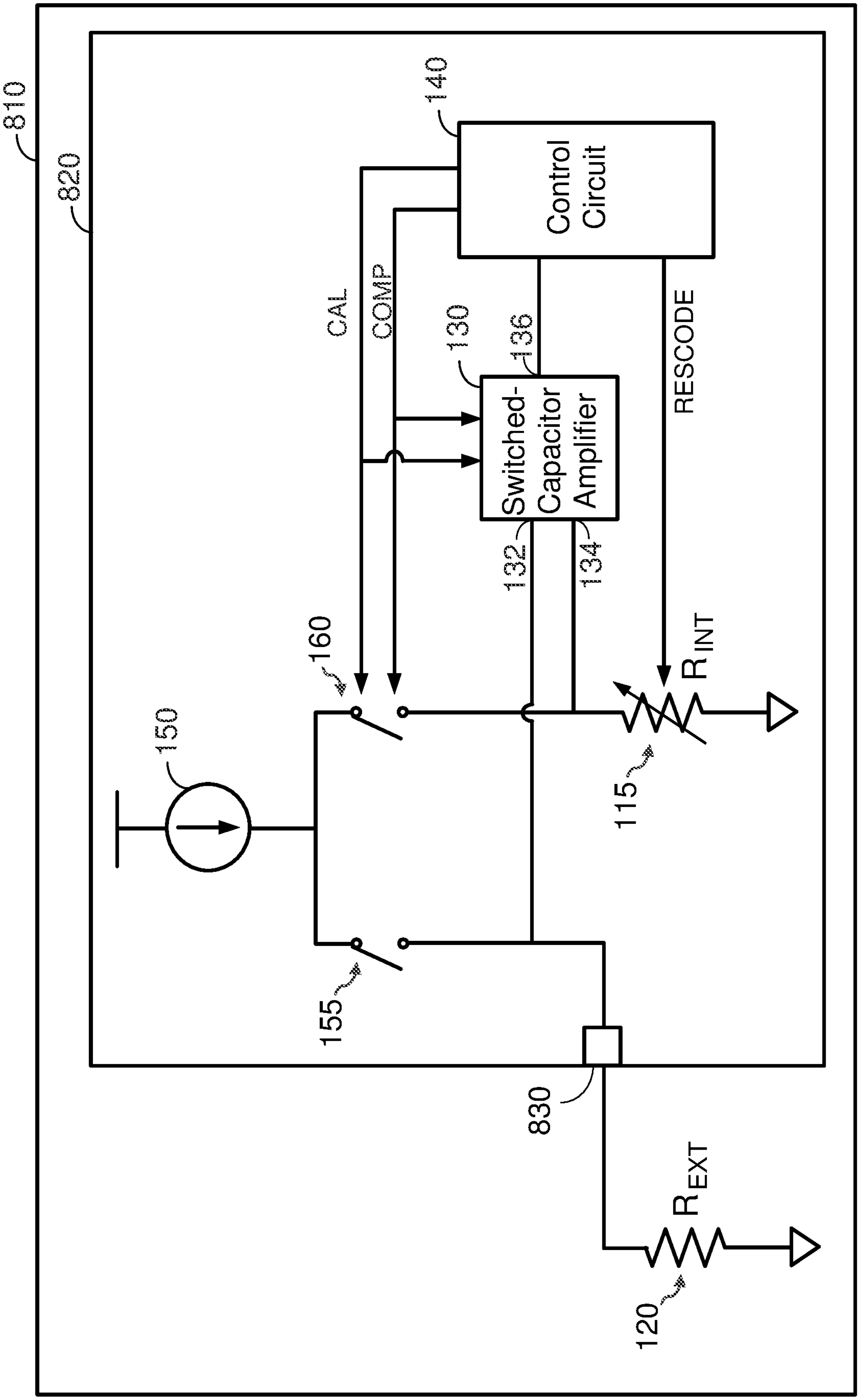
FIG. 8 shows an example of an external resistor and a chip including an on-chip resistor according to certain aspects of the present disclosure.

FIG. 8 shows an example of a chip 820 including the on-chip resistor 115 according to certain aspects. In this example, the switches 155 and 160, the current source 150, the switched-capacitor amplifier 130, and the control circuit 140 may also be integrated on the chip 820. The switched-capacitor amplifier 130 includes the multi-stage amplifier 250 (not shown in FIG. 8) according to any of the exemplary implementations shown in FIGS. 5-7.

In this example, the chip 820 includes a pad 830 for coupling the external resistor 120 to the chip 820. On the chip 820, the first switch 155 is coupled between the current source 150 and the pad 830, and the external resistor 120 is coupled to the pad 830. In the example shown in FIG. 8, the chip 820 is mounted on a substrate 810 (e.g., a printed circuit board (PCB), a ceramic, a multilayer laminate, or any combination thereof). The external resistor 120 may be mounted on or embedded in the substrate 810 and coupled to the pad 830 on the chip 820 (e.g., by a metal trace, a solder bump, a wire, or any combination thereof).

In this example, the on-chip resistor 115 may be used in a voltage reference circuit integrated on the chip 820, a current reference circuit integrated on the chip 820, or another type of circuit integrated on the chip. The on-chip resistor 115 may also be used as a termination resistor (e.g., to provide impedance matching in a front-end transceiver integrated on the chip 820).

Figure 9:
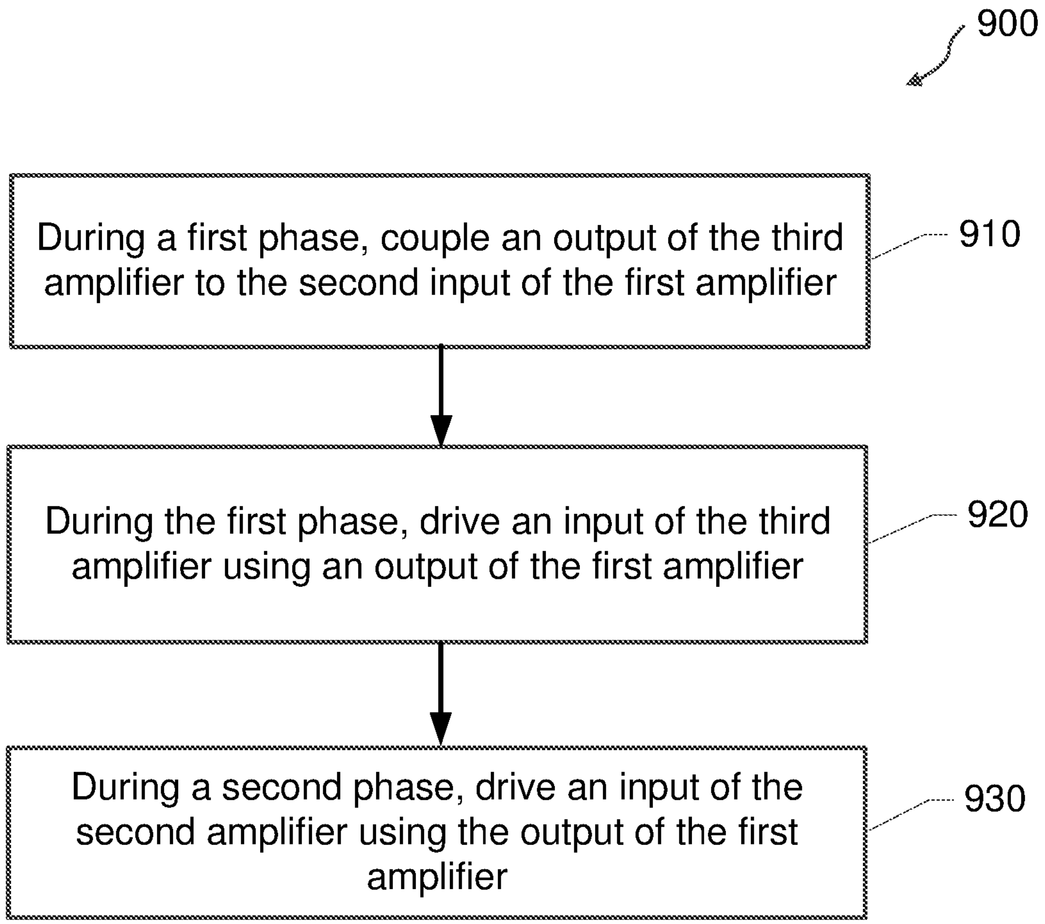
FIG. 9 is a flowchart illustrating an example of a method of operating a multi-stage amplifier according to certain aspects of the present disclosure.

FIG. 9 shows an example of a method 900 of operating a multi-stage amplifier according to certain aspects. The multi-stage amplifier (e.g., the multi-stage amplifier 250) includes a first amplifier (e.g., the first amplifier 510) having a first input (e.g., the first input 512) and a second input (e.g., the second input 514), a second amplifier (e.g., the second amplifier 520), and a third amplifier (e.g., the third amplifier 540).

At block 910, during a first phase, an output of the third amplifier is coupled to the second input of the first amplifier. For example, the output (e.g., output 544) of the third amplifier may be coupled to the second input of the first amplifier by closing a switch (e.g., the sixth switch 240) between the output of the third amplifier and the second input of the first amplifier.

At block 920, during the first phase, an input of the third amplifier is driven using an output of the first amplifier. For example, the input of the third amplifier may correspond to the input 542 of the third amplifier 540 and the output of the first amplifier may correspond to the output 516 of the first amplifier 510.

At block 930, during a second phase, an input of the second amplifier is driven using the output of the first amplifier. For example, the input of the second amplifier may correspond to the input 522 of the second amplifier 520.

In some implementations, the second amplifier includes one or more inverters (e.g., inverters 532 and 534) and the third amplifier includes a source-follower amplifier (e.g., source-follower amplifier 560). For example, the one or more inverters may be used to provide a rail-to-rail signal during the second phase and the source-follower amplifier may be used to provide voltage level shifting during the first phase (e.g., for low common mode voltage operation during the first phase). In some implementations, the first amplifier comprises a cascode amplifier (e.g., a folded-cascode amplifier).

In certain aspects, the method 900 may further include, during the first phase, sampling a first voltage using a first capacitor, and coupling a second capacitor between the first input and the second input of the first amplifier. For example, the first capacitor may correspond to the first capacitor 210 and the second capacitor may correspond to the second capacitor 220. In this example, the first capacitor 210 may sample the first voltage by closing the third switch 225 and the second capacitor 220 may be coupled between the first input and the second input of the first amplifier by closing the fifth switch 235. The second capacitor may be coupled between the first input and the second input of the first amplifier to sample an input offset voltage of the first amplifier (e.g., to compensate for the input offset voltage during the second phase).

The method 900 may further include, during the second phase, sampling a second voltage using the second capacitor, and generating an output signal at the output of the first amplifier based on the first voltage and the second voltage, wherein driving the input of the second amplifier using the output of first amplifier comprises driving the input of the second amplifier with the output signal. For example, the second capacitor 220 may sample the second voltage by closing the fourth switch 230.

In certain aspects, the first voltage may include a voltage across a first resistor (e.g., the external resistor 120) and the second voltage may include a voltage across a second resistor (e.g., the on-chip resistor 115). In this example, the method 900 may further include adjusting a resistance of the second resistor based on an output of the second amplifier.

The control circuit 140 may include a finite state machine, a microcontroller, an application specific integrated circuit (ASIC), a field programmable gate array (FPGA), a programmable logic device, a discrete gate or transistor logic component, a discrete hardware component, or any combination thereof configured to perform the operations discussed above according to various aspects of the present disclosure.

Implementation examples are described in the following numbered clauses:

1. An apparatus, comprising:
   - a multi-stage amplifier, wherein the multi-stage amplifier comprises:
     - a first amplifier having a first input, a second input, and an output;
     - a second amplifier having an input and an output, wherein the input of the second amplifier is coupled to the output of the first amplifier; and
     - a third amplifier having an input and an output, wherein the input of the third amplifier is coupled to the output of the first amplifier; and
   - a feedback switch coupled between the output of the third amplifier and the second input of the first amplifier.
2. The apparatus of clause 1, wherein:
   - the second amplifier comprises one or more inverters coupled in series; and
   - the third amplifier comprises a source-follower amplifier.
3. The apparatus of clause 2, wherein the first amplifier comprises a cascode amplifier.
4. The apparatus of clause 2 or 3, wherein the source-follower amplifier comprises:
   - a transistor, wherein a drain of the transistor is coupled to a supply rail, a gate of the transistor is coupled to the input of the third amplifier, and a source of the transistor is coupled to the output of the third amplifier; and a current source coupled between the source of the transistor and a ground.

5. The apparatus of any one of clauses 1 to 4, further comprising a control circuit coupled to the output of the second amplifier, wherein the control circuit is configured to adjust a resistance of a programmable resistor based on the output of the second amplifier.

6. The apparatus of any one of clauses 1 to 5, wherein:
when the feedback switch is closed, the first amplifier and the third amplifier are coupled in a closed loop; and
the second amplifier is outside of the closed loop.

7. The apparatus of clause 6, further comprising a control circuit coupled to the output of the second amplifier, wherein the control circuit is configured to:
receive an output signal from the output of the second amplifier when the feedback switch is open, and
adjust a resistance of a programmable resistor based on the output signal.

8. The apparatus of any one of clauses 1 to 7, further comprising:
a first capacitor, wherein a terminal of the first capacitor is coupled to the first input of the first amplifier;
a second capacitor;
a first switch coupled between a first resistor and the first input of the first amplifier;
a second switch coupled between a second resistor and a first terminal of the second capacitor, wherein a second terminal of the second capacitor is coupled to the second input of the first amplifier; and
a third switch coupled between the first terminal of the second capacitor and the first input of the first amplifier.

9. The apparatus of clause 8, wherein the first amplifier and the second resistor are integrated on a chip, and the first resistor is external to the chip.

10. The apparatus of clause 8 or 9, further comprising a control circuit configured to:
during a first phase, close the first switch, the third switch, and the feedback switch, and open the second switch; and
during a second phase, close the second switch, and open the first switch, the third switch, and the feedback switch.

11. The apparatus of clause 10, wherein the control circuit is coupled to the output of the second amplifier, and the control circuit is configured to:
during the second phase, receive an output signal from the output of the second amplifier; and
adjust a resistance of the second resistor based on the output signal.

12. A method of operating a multi-stage amplifier, the multi-stage amplifier including a first amplifier having a first input and a second input, a second amplifier, and a third amplifier, the method comprising:
during a first phase,
coupling an output of the third amplifier to the second input of the first amplifier; and
driving an input of the third amplifier using an output of the first amplifier; and
during a second phase,
driving an input of the second amplifier using the output of the first amplifier.

13. The method of clause 12, wherein:
the second amplifier comprises one or more inverters; and
the third amplifier comprises a source-follower amplifier.

14. The method of clause 13, wherein the first amplifier comprises a cascode amplifier.

15. The method of any one of clauses 12 to 14, further comprising:
during the first phase,
sampling a first voltage using a first capacitor; and
coupling a second capacitor between the first input and the second input of the first amplifier.

16. The method of clause 15, further comprising:
during the second phase,
sampling a second voltage using the second capacitor; and
generating an output signal at the output of the first amplifier based on the first voltage and the second voltage, wherein driving the input of the second amplifier using the output of the first amplifier comprises driving the input of the second amplifier with the output signal.

17. The method of clause 16, wherein:
the first voltage includes a voltage across a first resistor; and
the second voltage includes a voltage across a second resistor.

18. The method of clause 17, further comprising adjusting a resistance of the second resistor based on an output of the second amplifier.

19. The method of any one of clauses 12 to 18, wherein coupling the output of the third amplifier to the second input of the first amplifier comprises closing a switch between the output of the third amplifier and the second input of the first amplifier.

20. The method of clause 19, further comprising opening the switch during the second phase.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. It is also to be appreciated that the term "ground" may refer to a direct current (DC) ground or an alternating current (AC) ground, and thus the term "ground" covers both possibilities. An AC ground may be provided by a DC voltage. As used herein, "approximately" means within 10 percent of the stated value (i.e., within a range between 90 percent of the stated value and 110 percent of the stated value).

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:

a multi-stage amplifier, wherein the multi-stage amplifier comprises:

a first amplifier having a first input, a second input, and an output;

a second amplifier having an input and an output, wherein the input of the second amplifier is coupled to the output of the first amplifier; and a third amplifier having an input and an output, wherein the input of the third amplifier is coupled to the output of the first amplifier;

a feedback switch coupled between the output of the third amplifier and the second input of the first amplifier; and a control circuit coupled to the output of the second amplifier, wherein the control circuit is configured to adjust a resistance of a programmable resistor based on the output of the second amplifier.

2. The apparatus of claim 1, wherein:

the second amplifier comprises one or more inverters; and the third amplifier comprises a source-follower amplifier.

3. The apparatus of claim 2, wherein the first amplifier comprises a cascode amplifier.

4. The apparatus of claim 2, wherein the source-follower amplifier comprises:

a transistor, wherein a drain of the transistor is coupled to a supply rail, a gate of the transistor is coupled to the input of the third amplifier, and a source of the transistor is coupled to the output of the third amplifier; and a current source coupled between the source of the transistor and a ground.

5. The apparatus of claim 1, wherein:

when the feedback switch is closed, the first amplifier and the third amplifier are coupled in a closed loop; and the second amplifier is outside of the closed loop.

6. The apparatus of claim 5, wherein the control circuit is configured to:

receive an output signal from the output of the second amplifier when the feedback switch is open, and adjust the resistance of the programmable resistor based on the output signal.

7. An apparatus, comprising:

a multi-stage amplifier, wherein the multi-stage amplifier comprises:

a first amplifier having a first input, a second input, and an output;

a second amplifier having an input and an output, wherein the input of the second amplifier is coupled to the output of the first amplifier; and a third amplifier having an input and an output, wherein the input of the third amplifier is coupled to the output of the first amplifier;

a feedback switch coupled between the output of the third amplifier and the second input of the first amplifier;

a first capacitor, wherein a terminal of the first capacitor is coupled to the first input of the first amplifier;

a second capacitor;

a first switch coupled between a first resistor and the first input of the first amplifier;

a second switch coupled between a second resistor and a first terminal of the second capacitor, wherein a second terminal of the second capacitor is coupled to the second input of the first amplifier; and a third switch coupled between the first terminal of the second capacitor and the first input of the first amplifier.

8. The apparatus of claim 7, wherein the first amplifier and the second resistor are integrated on a chip, and the first resistor is external to the chip.

9. The apparatus of claim 7, further comprising a control circuit configured to:

during a first phase, close the first switch, the third switch, and the feedback switch, and open the second switch; and during a second phase, close the second switch, and open the first switch, the third switch, and the feedback switch.

10. The apparatus of claim 9, wherein the control circuit is coupled to the output of the second amplifier, and the control circuit is configured to:

during the second phase, receive an output signal from the output of the second amplifier; and adjust a resistance of the second resistor based on the output signal.

11. A method of operating a multi-stage amplifier, the multi-stage amplifier including a first amplifier having a first input and a second input, a second amplifier, and a third amplifier, the method comprising:

during a first phase, coupling an output of the third amplifier to the second input of the first amplifier;

driving an input of the third amplifier using an output of the first amplifier;

sampling a first voltage using a first capacitor; and coupling a second capacitor between the first input and the second input of the first amplifier; and during a second phase, driving an input of the second amplifier using the output of the first amplifier.

12. The method of claim 11, wherein:

the second amplifier comprises one or more inverters; and the third amplifier comprises a source-follower amplifier.

13. The method of claim 12, wherein the first amplifier comprises a cascode amplifier.

14. The method of claim 11, further comprising:

during the second phase, coupling the second capacitor between a second voltage and the second input of the first amplifier; and generating an output signal at the output of the first amplifier, wherein the first capacitor is coupled to the first input of the first amplifier, and driving the input of the second amplifier using the output of the first amplifier comprises driving the input of the second amplifier with the output signal.

15. The method of claim 14, wherein:

the first voltage includes a voltage across a first resistor; and the second voltage includes a voltage across a second resistor.

16. The method of claim 15, further comprising adjusting a resistance of the second resistor based on an output of the second amplifier.

17. The method of claim 11, wherein coupling the output of the third amplifier to the second input of the first amplifier comprises closing a switch between the output of the third amplifier and the second input of the first amplifier.

18. The method of claim 17, further comprising opening the switch during the second phase.

* * * * *